US012707899B2

(12) United States Patent
Tang et al.

(10) Patent No.: US 12,707,899 B2
(45) Date of Patent: Aug. 11, 2026

(54) MAGNETO RESISTIVE ELEMENT WITH LAMINATE COMPONENT AND MAGNETIC MEMORY

(71) Applicant: TDK CORPORATION, Tokyo (JP)

(72) Inventors: Zhenyao Tang, Tokyo (JP); Tomoyuki Sasaki, Tokyo (JP)

(73) Assignee: TDK CORPORATION, Tokyo (JP)

( * ) Notice: Subject to any disclaimer, the term of this patent is extended or adjusted under 35 U.S.C. 154(b) by 955 days.

(21) Appl. No.: 17/851,858

(22) Filed: Jun. 28, 2022

(65) Prior Publication Data

US 2023/0068442 A1 Mar. 2, 2023

(30) Foreign Application Priority Data

Aug. 27, 2021 (WO) .................. PCT/JP2021/031551

(51) Int. Cl.
*H10N 50/80* (2023.01)
*H10B 61/00* (2023.01)

(52) U.S. Cl.
CPC ............. *H10N 50/80* (2023.02); *H10B 61/00* (2023.02)

(58) Field of Classification Search
CPC ................................ H10N 50/80; H10B 61/00
USPC .......................................................... 257/421
See application file for complete search history.

(56) References Cited

U.S. PATENT DOCUMENTS 7,355,821 B2 * 4/2008 Suda .................... G11B 5/1272
8,836,000 B1 9/2014 Lin
9,184,375 B1 11/2015 Tang et al.
11,227,644 B2 * 1/2022 O'Brien ................. H10N 50/01
2004/0105320 A1 * 6/2004 Kajiyama .............. H10B 61/00 257/E27.005
2005/0101035 A1 * 5/2005 Nickel ................... H10N 50/01 257/E43.006
2006/0139992 A1 * 6/2006 Hwang ................... G11C 11/15 365/158
2008/0304353 A1 12/2008 Abraham et al.
2010/0188893 A1 * 7/2010 Zhou ................... G11C 11/1659 365/171
2010/0289098 A1 * 11/2010 Li .......................... H10N 50/80 700/121
2011/0089511 A1 4/2011 Keshtbod et al.
2011/0260272 A1 10/2011 Lee et al.
2012/0241835 A1 * 9/2012 Sugawara ............ H10D 30/681 257/316
2014/0264513 A1 9/2014 De Brosse et al.
2015/0171315 A1 6/2015 Gan et al.
2016/0233417 A1 8/2016 Lee et al.
2020/0194311 A1 6/2020 Tang et al.
(Continued)

FOREIGN PATENT DOCUMENTS

JP 2021-103771 A 7/2021

*Primary Examiner* — Jami Valentine Miller
(74) *Attorney, Agent, or Firm* — Oliff PLC

(57) ABSTRACT

A magneto resistive element includes a laminate that includes a first ferromagnetic layer, a second ferromagnetic layer, and a non-magnetic layer located between the first ferromagnetic layer and the second ferromagnetic layer; a first conductive layer that is connected to a first surface of the laminate in a lamination direction; and a second conductive layer that is connected to a second surface opposite the first surface. The first surface of the laminate includes a first region which comes into contact with the first conductive layer and a second region which does not come into contact with the first conductive layer.

13 Claims, 11 Drawing Sheets

(56) References Cited

U.S. PATENT DOCUMENTS

| | | | | |
|---|---|---|---|---|
| 2021/0036054 | A1* | 2/2021 | Gallagher | H10N 50/10 |
| 2021/0193913 | A1 | 6/2021 | Ichikawa et al. | |
| 2022/0130441 | A1* | 4/2022 | Houssameddine | G11C 11/5607 |
| 2022/0190235 | A1* | 6/2022 | van der Straten | H10B 61/00 |
| 2023/0068442 | A1* | 3/2023 | Tang | H10N 50/85 |
| 2024/0407179 | A1* | 12/2024 | Boivin | H10N 70/231 |

* cited by examiner

MAGNETO RESISTIVE ELEMENT WITH LAMINATE COMPONENT AND MAGNETIC MEMORY

CROSS-REFERENCE TO RELATED APPLICATION

Priority is claimed on International Patent Application No. PCT/JP2021/031551, filed Aug. 27, 2021, the content of which is incorporated herein by reference.

BACKGROUND OF THE INVENTION

Field of the Invention

The present invention relates to a magneto resistive element and a magnetic memory.

Description of Related Art

Magneto resistive elements are elements of which a resistance value in a lamination direction changes due to a magnetic resistance effect. A magneto resistive element includes two ferromagnetic layers and a non-magnetic layer sandwiched therebetween. A magneto resistive element in which a conductor is used as a non-magnetic layer is referred to as a giant magneto resistive (GMR) element, and a magneto resistive element in which an insulating layer (a tunnel barrier layer or a barrier layer) is used as a non-magnetic layer is referred to as a tunnel magneto resistive (TMR) element. Magneto resistive elements can be applied for various purposes, such as magnetic sensors, high-frequency components, magnetic heads, and nonvolatile random access memories (MRAM).

There are several methods for writing data in a magneto resistive element. For example, a method for performing writing utilizing a spin-transfer torque (STT) as disclosed in Japanese Unexamined Patent Application, First Publication No. 2021-103771, and a method for performing writing utilizing a spin-orbit torque (SOT) as disclosed in United States Patent Application, Publication No. 2014/0264513 are known. In a writing method utilizing an STT, a writing current flows in a lamination direction of a laminate including two ferromagnetic layers sandwiching a non-magnetic layer therebetween. In a writing method utilizing an SOT, a writing current flows in a direction intersecting the lamination direction of a laminate including two ferromagnetic layers sandwiching a non-magnetic layer therebetween.

SUMMARY OF THE INVENTION

A magneto resistive element according to a first aspect includes a laminate that includes a first ferromagnetic layer, a second ferromagnetic layer, and a non-magnetic layer located between the first ferromagnetic layer and the second ferromagnetic layer; a first conductive layer that is connected to a first surface of the laminate in a lamination direction; and a second conductive layer that is connected to a second surface opposite the first surface. The first surface of the laminate includes a first region which comes into contact with the first conductive layer and a second region which does not come into contact with the first conductive layer.

DETAILED DESCRIPTION OF THE INVENTION

Figure 1:
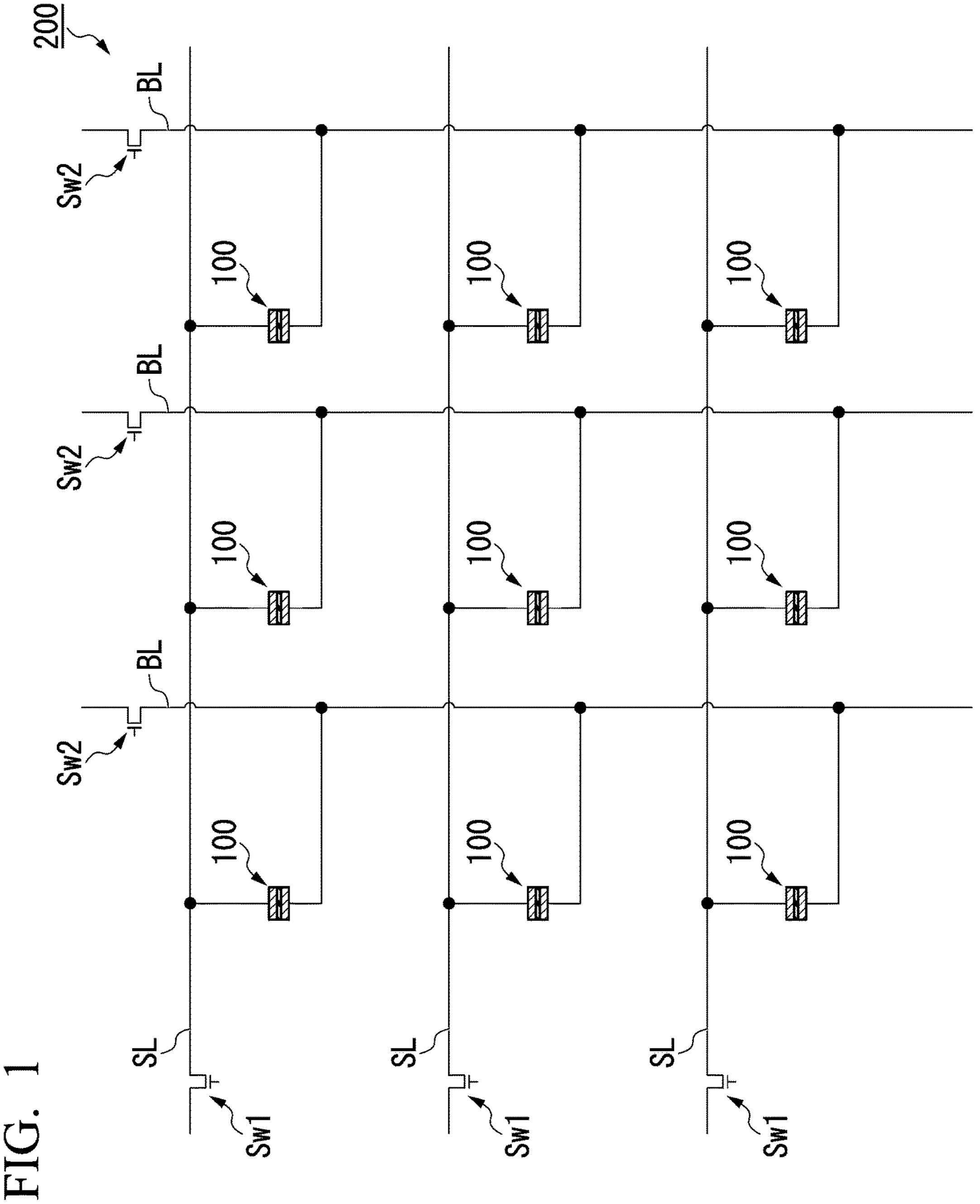
FIG. 1 is a circuit diagram of a magnetic memory according to a first embodiment.

When writing is performed utilizing an STT, a non-magnetic layer may be damaged due to a writing current flowing in a lamination direction of a laminate. If a non-magnetic layer is damaged, the life span of a magneto resistive element is shortened so that the reliability thereof is degraded. In order to reduce damage to a non-magnetic layer, there is a demand for a magneto resistive element in which writing is facilitated. A magneto resistive element and a magnetic memory according to the present embodiment have excellent writing efficiency.

Hereinafter, the present embodiment will be described in detail suitably with reference to the drawings. In the drawings used in the following description, in order to make characteristics of the present embodiment easy to understand, characteristic parts may be illustrated in an enlarged manner for the sake of convenience, and dimensional ratios or the like of each constituent element may differ from actual values thereof. Materials, dimensions, and the like exemplified in the following description are examples. The present invention is not limited thereto and can be changed and performed within a range not changing the gist thereof suitably.

First, directions will be defined. The lamination direction of a laminate 10 (which will be described below) will be referred to as a z direction. A direction orthogonal to the z direction will be referred to as an x direction, and a direction orthogonal to the x direction and the z direction will be referred to as a y direction. The z direction is an example of the lamination direction. A direction from a first conductive layer 20 toward a second conductive layer 30 will be referred to as a positive z direction. Hereinafter, the positive z direction may be expressed as "upward", and a negative z direction may be expressed as "downward". The upward and downward directions do not necessarily coincide with a direction in which gravity is applied.

First Embodiment

FIG. 1 is a circuit diagram of a magnetic memory 200 according to a first embodiment. The magnetic memory 200 includes a plurality of magneto resistive elements 100, a plurality of source lines SL, a plurality of bit lines BL, a plurality of first switching elements Sw1, and a plurality of second switching elements Sw2.

For example, the plurality of magneto resistive elements 100 are arrayed in a matrix shape. Each magneto resistive element 100 is connected to the source line SL and the bit line BL.

The source line SL electrically connects the first switching element Sw1 and the magneto resistive element 100 to each other. The bit line BL electrically connects the second switching element Sw2 and the magneto resistive element 100 to each other.

When a predetermined first switching element Sw1 and a predetermined second switching element Sw2 are turned on, a current flows in a predetermined magneto resistive element 100. A current also flows in the lamination direction of the magneto resistive element 100 at the time of wiring and reading data. A writing current is greater than a reading current. A writing current causes a spin-transfer torque to act on magnetization of the magneto resistive element 100 such that data is written in the magneto resistive element 100. The magneto resistive element 100 is a two-terminal-type element operating with two switching elements.

The first switching element Sw1 and the second switching element Sw2 are elements controlling a flow of a current. For example, the first switching element Sw1 and the second switching element Sw2 are transistors, elements utilizing phase change of a crystal layer, such as ovonic threshold switches (OTS); elements utilizing change of a band structure, such as metal-insulator transition (MIT) switches; elements utilizing a breakdown voltage, such as Zener diodes or avalanche diodes; or elements of which conductivity changes in accordance with change in position of atoms.

Figure 2:
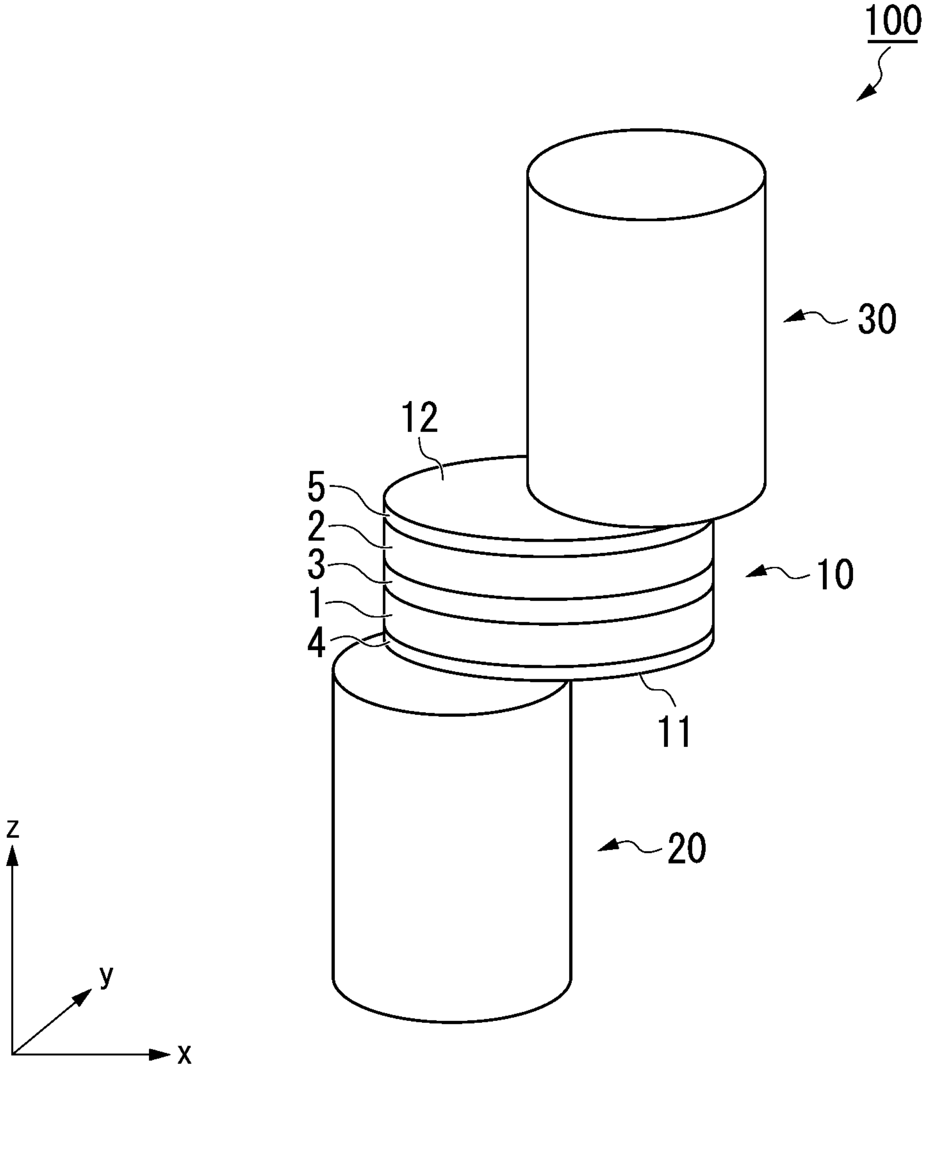
FIG. 2 is a perspective view of a magneto resistive element according to the first embodiment.

FIG. 2 is a perspective view of the magneto resistive element 100 according to the first embodiment. The magneto resistive element 100 has the laminate 10, the first conductive layer 20, and the second conductive layer 30. Each of the laminate 10, the first conductive layer 20, and the second conductive layer 30 is a columnar body.

An area of the magneto resistive element 100 is covered by an insulating layer (not illustrated). The insulating layer is an insulating layer insulating wirings or elements of a multilayer wiring. For example, the insulating layer is made of silicon oxide ($SiO_x$), silicon nitride ($SiN_x$), silicon carbide (SiC), chromium nitride, silicon carbonitride (SiCN), silicon oxynitride (SiON), aluminum oxide ($Al_2O_3$), zirconium oxide ($ZrO_x$), or the like.

The first conductive layer 20 is connected to a first surface 11 of the laminate 10. The second conductive layer 30 is connected to a second surface 12 of the laminate 10. The first surface 11 and the second surface 12 are two surfaces at both ends of the laminate 10 in the z direction, and they face each other. The first conductive layer 20 and the second conductive layer 30 are made of a conductive material. The first conductive layer 20 and the second conductive layer 30 are also referred to as via wirings. For example, the first conductive layer 20 and the second conductive layer 30 include any one selected from the group consisting of Al, Cu, Ta, Ti, Zr, NiCr, and nitrides (for example, TiN, TaN, and SiN).

For example, the laminate 10 includes a first ferromagnetic layer 1, a second ferromagnetic layer 2, a non-magnetic layer 3, a base layer 4, and a cap layer 5.

A resistance value of the laminate 10 changes when a relative angle between a magnetization of the first ferromagnetic layer 1 and a magnetization of the second ferromagnetic layer 2 changes. The magneto resistive element 100 stores data on the basis of the resistance value of the laminate 10. For example, a case in which the magnetization of the first ferromagnetic layer 1 and the magnetization of the second ferromagnetic layer 2 are parallel to each other will be referred to as "0", and a case in which the magnetization of the first ferromagnetic layer 1 and the magnetization of the second ferromagnetic layer 2 are antiparallel to each other will be referred to as "1".

Each of the first ferromagnetic layer 1 and the second ferromagnetic layer 2 has a magnetization. For example, in the magnetization of the first ferromagnetic layer 1, an orientation direction is less likely to change than that in the magnetization of the second ferromagnetic layer 2 when a predetermined external force is applied. In this case, the first ferromagnetic layer 1 is referred to as a magnetization fixed layer, and the second ferromagnetic layer 2 is referred to as a magnetization free layer or a magnetization reference layer. In order to enhance stability of the magnetization, the first ferromagnetic layer 1 may be on a substrate side which is the base rather than the second ferromagnetic layer 2. A case in which the first ferromagnetic layer 1 is a magnetization fixed layer and the second ferromagnetic layer 2 is a magnetization free layer has been described as an example, but the first ferromagnetic layer 1 may be a magnetization free layer and the second ferromagnetic layer 2 may be a magnetization fixed layer.

The first ferromagnetic layer 1 and the second ferromagnetic layer 2 include a ferromagnetic body. For example, a ferromagnetic body is a metal selected from the group consisting of Cr, Mn, Co, Fe, and Ni, an alloy including one or more kinds of these metals, an alloy including at least one or more kinds of elements of these metals, B, C, and N, or the like. For example, a ferromagnetic body is a Co—Fe, a Co—Fe—B, a Ni—Fe, a Co—Ho alloy, a Sm—Fe alloy, a Fe—Pt alloy, a Co—Pt alloy, or a CoCrPt alloy.

The first ferromagnetic layer 1 and the second ferromagnetic layer 2 may include a Heusler alloy. A Heusler alloy includes an intermetallic compound having a chemical composition of XYZ or $X_2YZ$. X is a transition metal element or a noble metal element of the Co group, the Fe group, the Ni group, or the Cu group in the periodic table, Y is a transition metal of the Mn group, the V group, the Cr group, or the Ti group or a kind of element as for X, and Z is a typical element from Group III to Group V. For example, a Heusler alloy is $Co_2FeSi$, $Co_2FeGe$, $Co_2FeGa$, $Co_2MnSi$, $Co_2Mn_{1-a}Fe_aAl_bSi_{1-b}$h, $Co_2FeGe_{1-c}Ga_c$, or the like. A Heusler alloy has a high spin polarization coefficient.

The first ferromagnetic layer 1 and the second ferromagnetic layer 2 may be constituted of a plurality of layers. The first ferromagnetic layer 1 and the second ferromagnetic layer 2 may be a synthetic antiferromagnetic structure (SAF structure). A synthetic antiferromagnetic structure is constituted of two magnetic layers sandwiching a spacer layer therebetween. A coercive force of a magnetic body increases by coupling two ferromagnetic layers sandwiching a spacer layer therebetween. For example, a spacer layer is made of Ru, Ir, Ta, Rh, or the like.

The non-magnetic layer 3 is sandwiched between the first ferromagnetic layer 1 and the second ferromagnetic layer 2 in the z direction.

The non-magnetic layer 3 includes a non-magnetic body. When the non-magnetic layer 3 is an insulator (when it is a tunnel barrier layer), for example, $Al_2O_3$, $SiO_2$, MgO, $MgAl_2O_4$, or the like can be used as a material thereof. Furthermore, in addition to these, a material in which a portion of Al, Si, or Mg is substituted with Zn, Be, or the like, or the like can be used. Among these, since MgO or $MgAl_2O_4$ is a material which can realize a coherent tunnel, spins can be efficiently injected. When the non-magnetic layer 3 is made of a metal, Cu, Au, Ag, or the like can be used as a material thereof. Moreover, when the non-magnetic layer 3 is a semiconductor, Si, Ge, $CuInSe_2$, $CuGaSe_2$, $Cu(In,Ga)Se_2$, or the like can be used as a material thereof.

The base layer 4 is on the substrate side supporting the laminate 10. For example, the base layer 4 is located between the first conductive layer 20 and the first ferromagnetic layer 1. For example, the base layer 4 is a seed layer or a buffer layer. A seed layer enhances crystallinity of a layer laminated on the seed layer. For example, a seed layer is made of Pt, Ru, Hf, Zr, or NiFeCr. A buffer layer is a layer alleviating lattice mismatch between different crystals. For example, a buffer layer is made of Ta, Ti, W, Zr, Hf, or nitride of these elements.

The cap layer 5 is on a side away from a substrate of the laminate 10. For example, the cap layer 5 is located between the second conductive layer 30 and the second ferromagnetic layer 2. The cap layer 5 prevents damage to an underlayer during a process and enhances crystallinity of an underlayer at the time of annealing. For example, the cap layer 5 is made of MgO, W, Mo, Ru, Ta, Cu, or Cr or is constituted of a laminated film or the like.

The laminate 10 may have a layer other than the first ferromagnetic layer 1, the second ferromagnetic layer 2, the non-magnetic layer 3, the base layer 4, and the cap layer 5. In addition, the laminate 10 may not have the base layer 4 and the cap layer 5.

Figure 3:
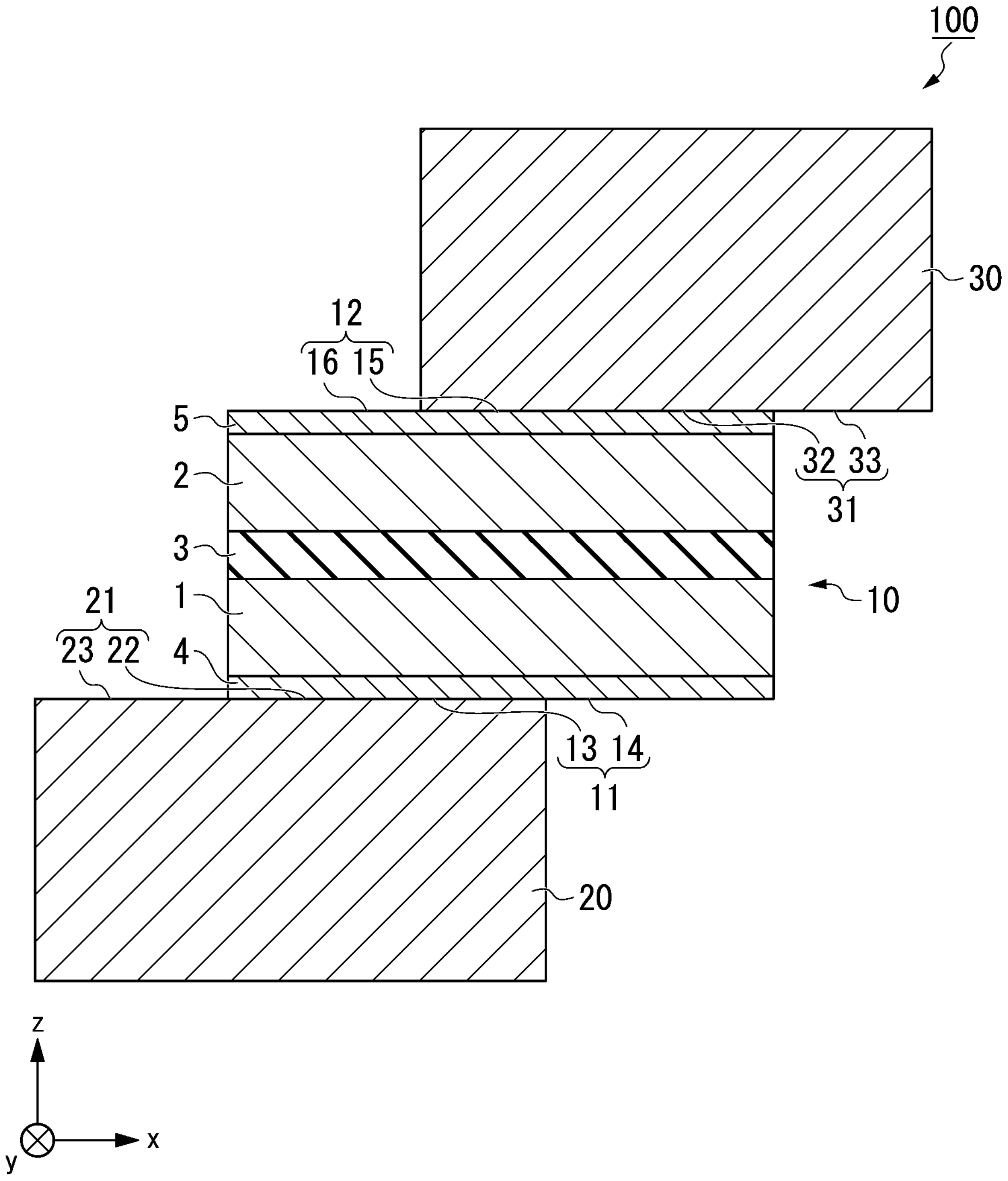
FIG. 3 is a cross-sectional view of the magneto resistive element according to the first embodiment.

FIG. 3 is a cross-sectional view of the magneto resistive element 100 according to the first embodiment. FIG. 3 is an xz-cross section passing through a geometrical center of the magneto resistive element 100.

A portion of the laminate 10 comes into contact with the first conductive layer 20. The first surface 11 of the laminate 10 has a first region 13 which comes into contact with the first conductive layer 20, and a second region 14 which does not come into contact with the first conductive layer 20. In addition, for example, a portion of the laminate 10 comes into contact with the second conductive layer 30. The second surface 12 of the laminate 10 has a third region 15 which comes into contact with the second conductive layer 30, and a fourth region 16 which does not come into contact with the second conductive layer 30.

For example, a first surface 21 of the first conductive layer 20 has a first region 22 which comes into contact with the laminate 10, and a second region 23 which does not come into contact with the laminate 10. The first surface 21 is a surface of the first conductive layer 20 on the laminate 10 side.

For example, a first surface 31 of the second conductive layer 30 has a first region 32 which comes into contact with the laminate 10, and a second region 33 which does not come into contact with the laminate 10. The first surface 31 is a surface of the second conductive layer 30 on the laminate 10 side.

Figure 4:
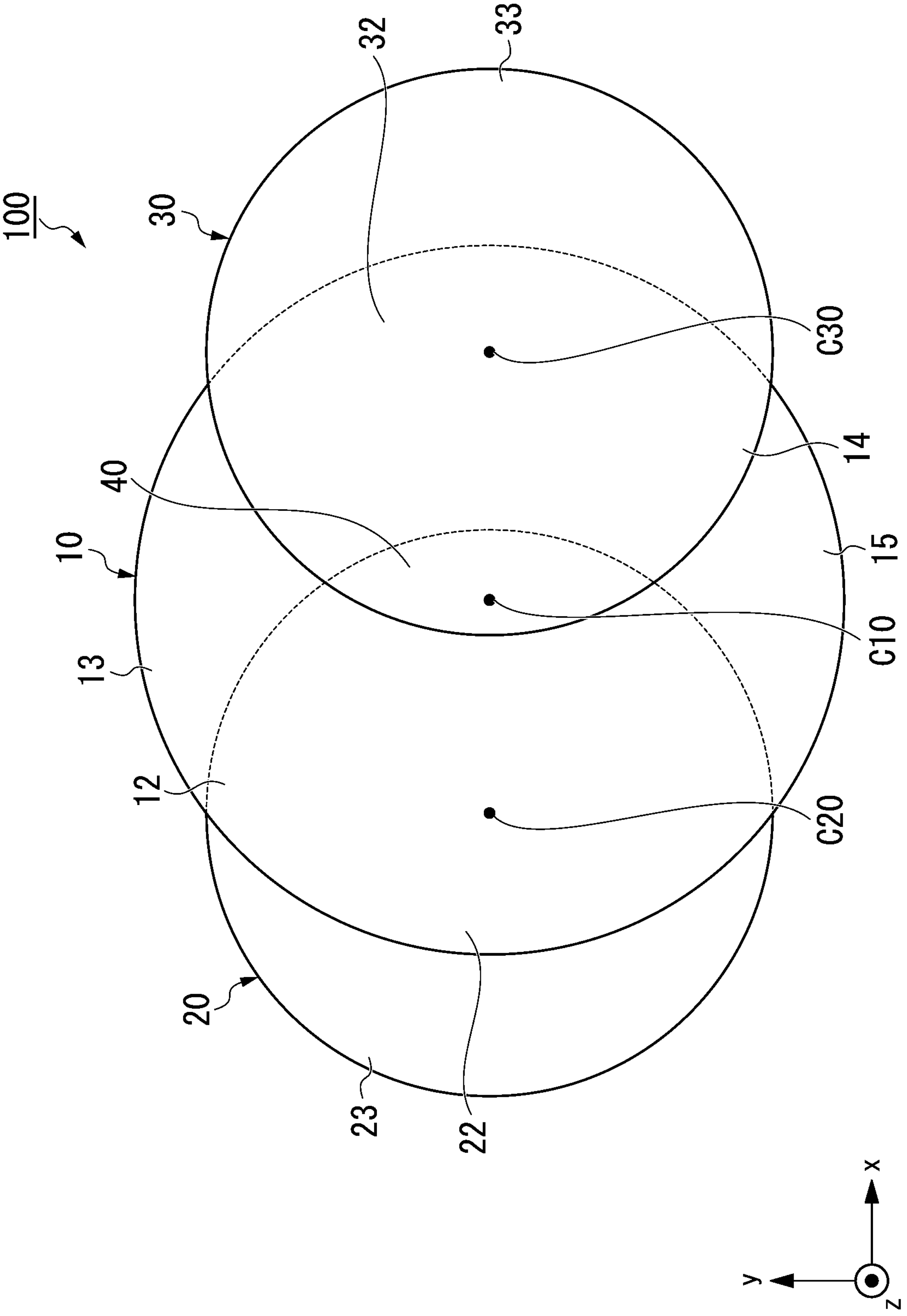
FIG. 4 is a plan view of the magneto resistive element according to the first embodiment.

FIG. 4 is a plan view of the magneto resistive element 100 according to the first embodiment.

When viewed in the z direction, the shapes of the laminate 10, the first conductive layer 20, and the second conductive layer 30 are circular shapes, for example. The shapes thereof in a plan view are not limited to circular shapes. For example, the shapes thereof in a plan view are elliptical shapes, oval shapes, quadrangular shapes, or the like.

For example, a geometrical center C10 of the laminate 10 is misaligned with a geometrical center C20 of the first conductive layer 20. For example, the geometrical center C10 of the laminate 10 is misaligned with a geometrical center C30 of the second conductive layer 30. For example, the geometrical center C20 of the first conductive layer 20 is misaligned with the geometrical center C30 of the second conductive layer 30.

In FIG. 4, the geometrical center C20 is located at a position overlapping the laminate 10 in the z direction, but the geometrical center C20 may be located on the outward side of the laminate 10 when viewed in the z direction. Similarly, the geometrical center C30 may be located on the outward side of the laminate 10 when viewed in the z direction. In addition, the geometrical center C10 may be located on the outward side of the first conductive layer 20 and the second conductive layer 30 when viewed in the z direction.

Figure 5:
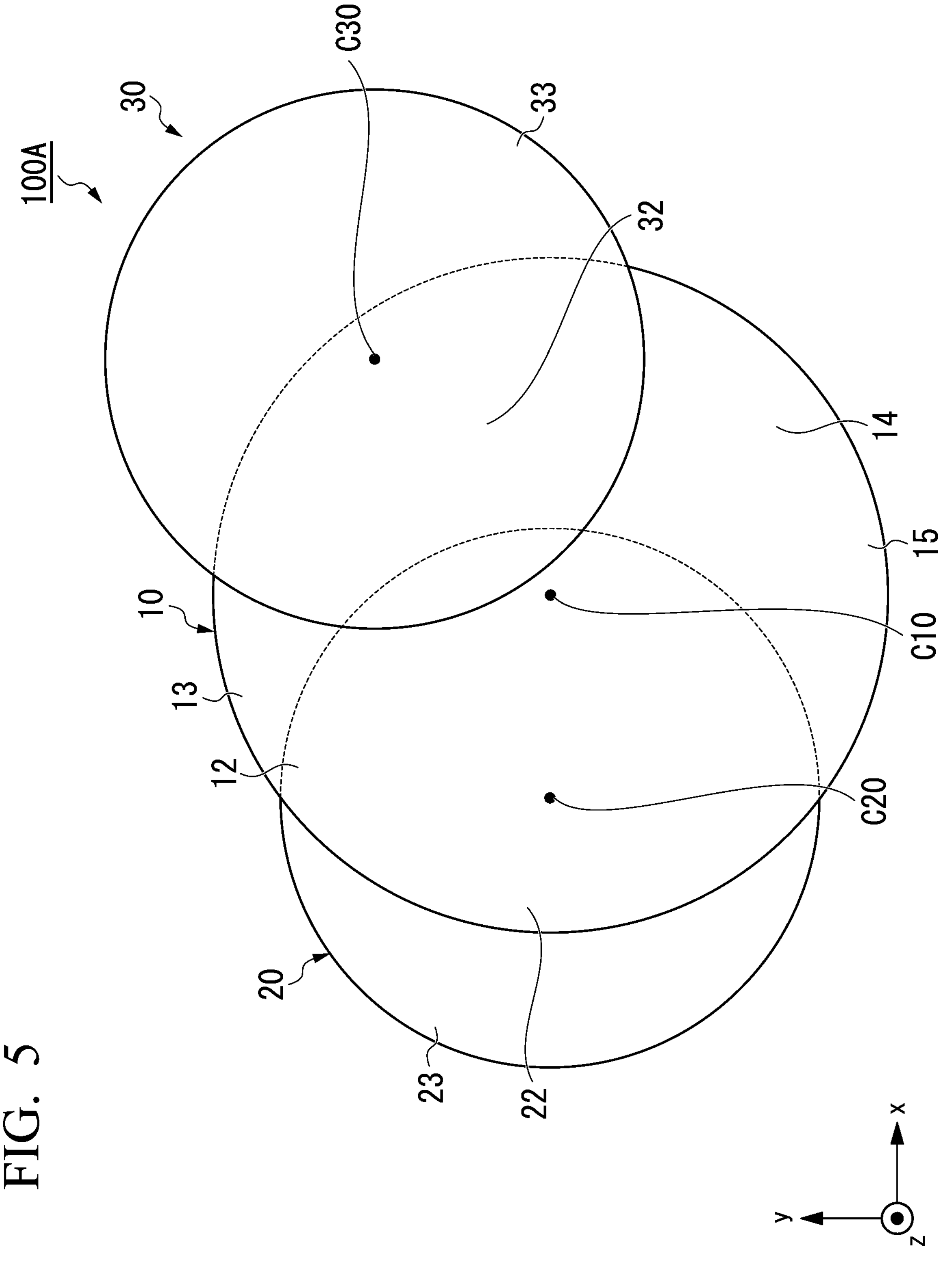
FIG. 5 is a plan view of a magneto resistive element according to a first modification example.

In FIG. 4, the geometrical center C20 and the geometrical center C30 are misaligned with the geometrical center C10 in the x direction. A misalignment direction of the geometrical center C20 and the geometrical center C30 with respect to the geometrical center C10 is not limited to this example, and it does not matter particularly. In addition, the geometrical center C10, the geometrical center C20, and the geometrical center C30 are not necessarily arranged on the same line. For example, as in a magneto resistive element 100A illustrated in FIG. 5, a segment connecting the geometrical center C10 and the geometrical center C20 to each other may intersect a segment connecting the geometrical center C10 and the geometrical center C30 to each other.

When viewed in the z direction, the first conductive layer 20 and the second conductive layer 30 may have parts overlapping each other (which will hereinafter be referred to as an overlapping part 40). A writing current is maximally concentrated in the overlapping part 40. Magnetization reversal of the second ferromagnetic layer 2 in its entirety is triggered when the magnetization of the overlapping part 40 is reversed.

A circumferential length of each of the laminate 10, the first conductive layer 20, and the second conductive layer 30 does not matter particularly. For example, the circumferential length of the first conductive layer 20 is shorter than the circumferential length of the laminate 10. In the cross section illustrated in FIG. 3, a width of the first conductive layer 20 in the x direction is shorter than a width of the laminate 10 in the x direction. For example, the circumferential length of the second conductive layer 30 is shorter than the circumferential length of the laminate 10. In the cross section illustrated in FIG. 3, a width of the second conductive layer 30 in the x direction is shorter than the width of the laminate 10 in the x direction. A surface area of a part in which the laminate 10 comes into contact with the first conductive layer 20 or the second conductive layer 30 can be narrowed by making the circumferential length of the first conductive layer 20 or the second conductive layer 30 shorter than the circumferential length (width) of the laminate 10. When a writing current is concentrated and flows in this part inside the laminate 10, the magnetization of the second ferromagnetic layer 2 is likely to be reversed.

The magneto resistive element 100 according to the first embodiment can be produced by repeating a laminating step and a processing step for each layer.

For example, the first conductive layer 20 can be produced by forming an opening in an insulating layer and filling the inside with a conductor.

The laminate 10 can be produced by flattening surfaces of the first conductive layer 20 and an insulating layer, laminating each of the layers thereafter, and processing the layers into predetermined shapes. For example, processing of the laminate 10 is performed by photolithography or the like. An area around the laminate 10 is covered by the insulating layer.

The second conductive layer 30 can be produced by flattening surfaces of the laminate 10 and an insulating layer, laminating the insulating layer thereafter, forming an opening in the insulating layer, and filling the inside with a conductor.

In the magneto resistive element 100 according to the first embodiment, the magnetization of the second ferromagnetic layer 2 can be reversed even with a small current. That is, the magneto resistive element 100 according to the first embodiment has a small inversion current density and high writing efficiency.

Figure 6:
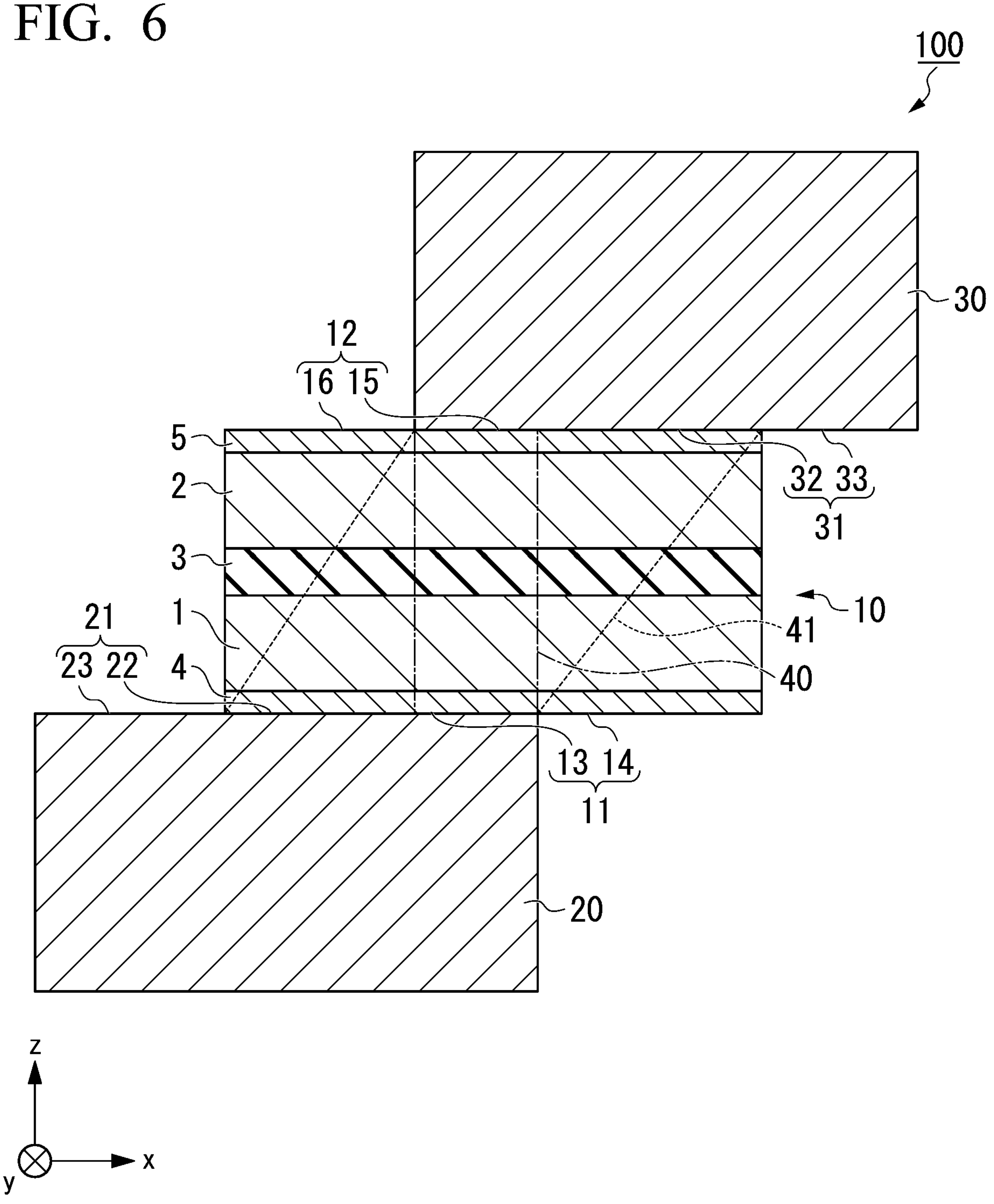
FIG. 6 is a schematic view for describing effects of the magneto resistive element according to the first embodiment.

FIG. 6 is a schematic view for describing effects of the magneto resistive element 100 according to the first embodiment.

When data is written in the magneto resistive element 100, a writing current is applied thereto in the z direction of the laminate 10. Inside the laminate 10, a writing current is concentrated in a first part 41 connecting the first region 13 in which the laminate 10 and the first conductive layer 20 come into contact with each other to the third region 15 in which the laminate 10 and the second conductive layer 30 come into contact with each other. In addition, a writing current is particularly concentrated in the overlapping part 40 inside the laminate 10.

The magnetization of the second ferromagnetic layer 2 is reversed when the current density of a writing current exceeds a predetermined value. When a writing current is concentrated in the first part 41, the current density of the first part 41 increases. When the current density of the first part 41 exceeds a predetermined value, the magnetization of the second ferromagnetic layer 2 in the first part 41 is reversed. When the magnetization of the second ferromagnetic layer 2 in the first part 41 is reversed, in order to retain magnetic stability, the magnetization of a part other than the first part 41 in the second ferromagnetic layer 2 is also reversed. That is, when there is a part in which a writing current is concentrated inside the laminate 10, magnetization reversal of this part becomes a trigger so that the magnetization of other parts is also easily reversed.

A current density of a writing current is a value obtained by dividing a current amount of a writing current by a surface area in which a current flows. When a writing current is concentrated in the first part 41, the surface area in which a current flows (denominator) is reduced. Therefore, even when the current amount of a writing current is small, the current density of the first part 41 can have a predetermined value or larger. Namely, in the magneto resistive element 100 according to the first embodiment, the magnetization of the second ferromagnetic layer 2 can be reversed with a small amount of writing current, and high writing efficiency is achieved.

In addition, as described above, a writing current is more likely to be concentrated in the overlapping part 40 than any part in the first part 41. Therefore, when the magneto resistive element 100 has the overlapping part 40, writing efficiency of the magneto resistive element 100 can be further enhanced.

In addition, in the laminate 10, a writing current flows in a direction inclined with respect to the z direction. That is, a writing current has a component in any direction within an xy plane (which will hereinafter be referred to as an in-plane component). The in-plane component of a writing current applies a spin-orbit torque (SOT) to the magnetization of the second ferromagnetic layer 2. That is, when a writing current has an in-plane component, a spin-orbit torque (SOT) is applied to the magnetization of the second ferromagnetic layer 2 in addition to a spin-transfer torque (STT). Since a spin-orbit torque (SOT) additionally acts on the magnetization thereof, the magneto resistive element 100 has high writing efficiency.

Second Embodiment

Figure 7:
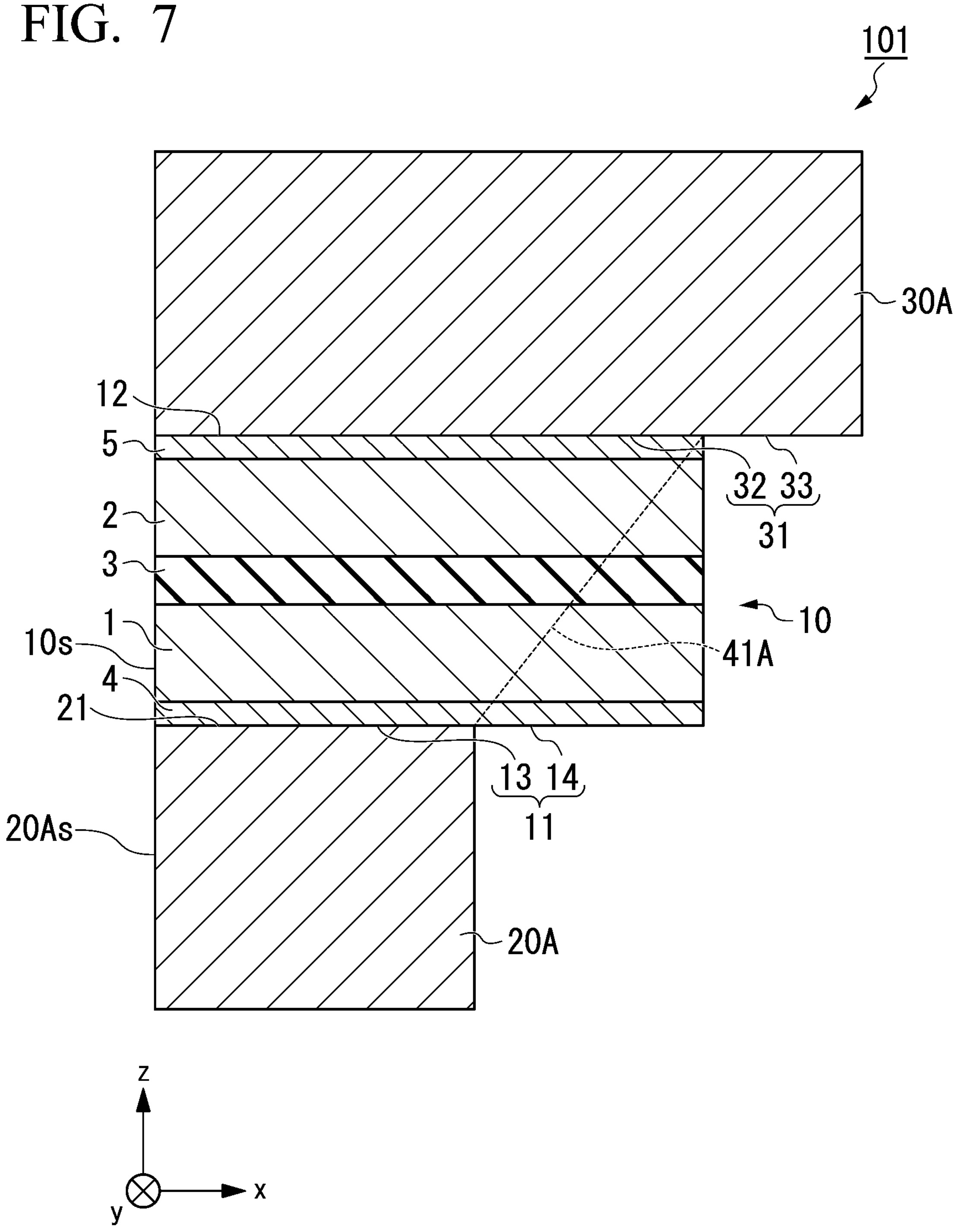
FIG. 7 is a cross-sectional view of a magneto resistive element according to a second embodiment.

FIG. 7 is a cross-sectional view of a magneto resistive element 101 according to a second embodiment. FIG. 7 illustrates a cross section which passes through a geometrical center of a first conductive layer 20A and the geometrical center of the laminate 10 viewed in the z direction and is cut in the z direction. In the magneto resistive element 101 according to the second embodiment, the same reference signs are applied to constituents similar to those of the magneto resistive element 100 according to the first embodiment, and description thereof will be omitted.

The magneto resistive element 101 has the first conductive layer 20A, the laminate 10, and a second conductive layer 30A.

The first conductive layer 20A differs from the first conductive layer 20 in that the entire first surface 21 comes into contact with the laminate 10. In addition, the second surface 12 of the laminate 10 comes into contact with the second conductive layer 30A on the entire surface thereof. The second conductive layer 30A has a longer circumferential length than the circumferential length of the laminate 10. As illustrated in FIG. 7, a side surface 20As of the first conductive layer 20A and a side surface 10*s* of the laminate 10 may be continuously formed. Here, continuously formed side surfaces denote that there is no step between boundary surfaces of different layers. For example, when a cross section is confirmed at a magnification at which the laminate 10 in its entirety can be confirmed, if inclinations of tangential lines of two side surfaces continuously change or are uniform, it can be said that the two side surfaces are continuously formed.

The magneto resistive element 101 according to the second embodiment has a first part 41A in which a writing current is concentrated, and a writing current flowing in the first part 41A has an in-plane component. Therefore, effects similar to those of the magneto resistive element 100 can be obtained.

Third Embodiment

Figure 8:
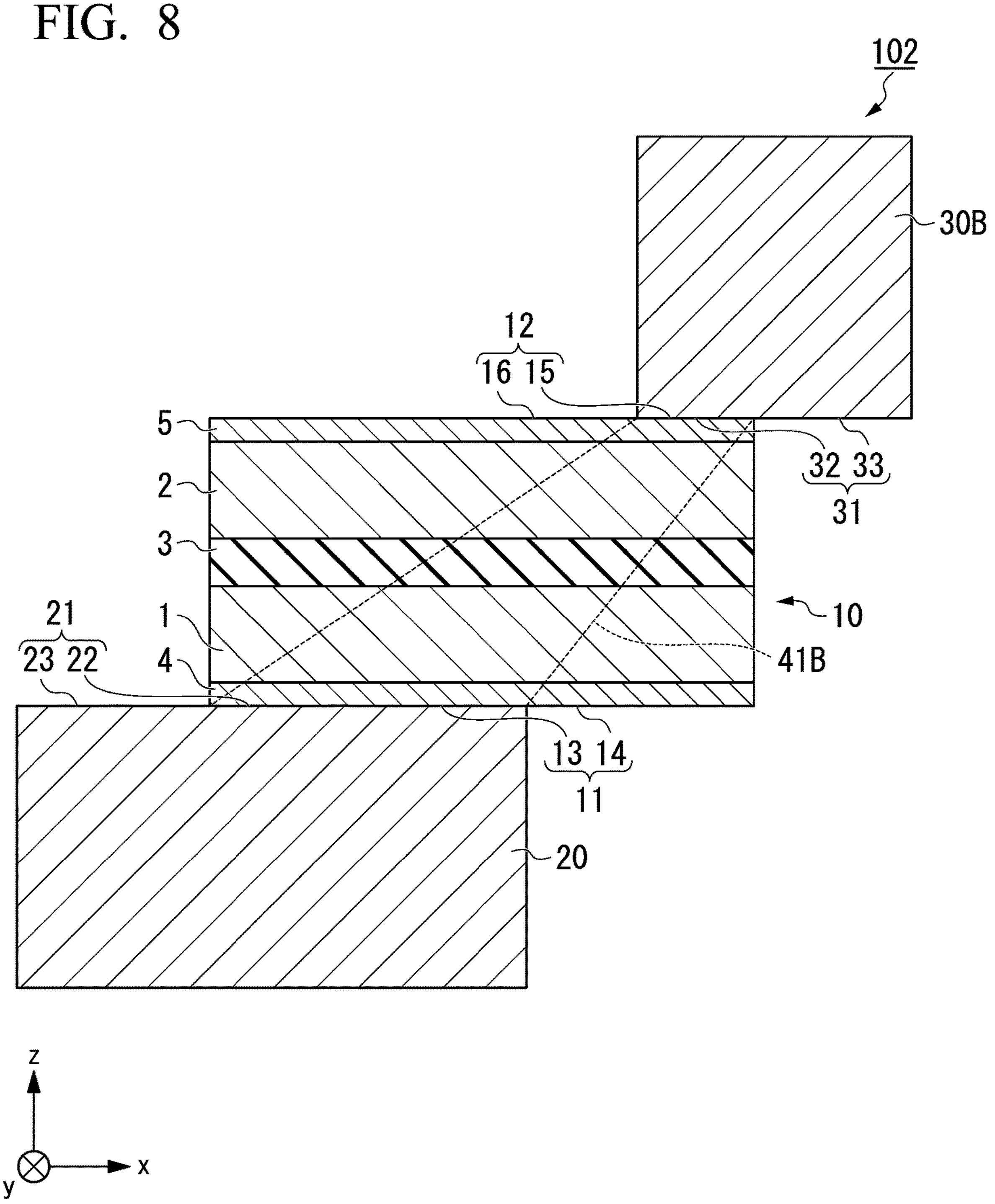
FIG. 8 is a cross-sectional view of a magneto resistive element according to a third embodiment.

FIG. 8 is a cross-sectional view of a magneto resistive element 102 according to a third embodiment. In the magneto resistive element 102 according to the third embodiment, the same reference signs are applied to constituents similar to those of the magneto resistive element 100 according to the first embodiment, and description thereof will be omitted.

In the magneto resistive element 102, the shape of a second conductive layer 30B differs from that in the magneto resistive element 100. In the magneto resistive element 102, the surface area of the third region 15 is narrower than the surface area of the first region 13. For this reason, a cross-sectional area of a first part 41B in which a writing current is concentrated becomes smaller as it goes closer to the second conductive layer 30B. The current density of the second ferromagnetic layer 2 is higher than the current density of the first ferromagnetic layer 1.

The first ferromagnetic layer 1 is a magnetization fixed layer. When the magnetization of the first ferromagnetic layer 1 is reversed, a reference to the resistance value fluctuates so that reliability of data of the magneto resistive element 102 is degraded. Unexpected magnetization reversal of the magnetization of the first ferromagnetic layer 1 is curbed by increasing the cross-sectional area of the first part 41B in the first ferromagnetic layer 1 and decreasing the current density at the time of passing through the first ferromagnetic layer 1.

The magneto resistive element 102 according to the third embodiment has the first part 41B in which a writing current is concentrated, and a writing current flowing in the first part 41B has an in-plane component. Therefore, effects similar to those of the magneto resistive element 100 can be obtained. In addition, in the magneto resistive element 102 according to the third embodiment, unexpected magnetization reversal of the magnetization of the first ferromagnetic layer 1 is curbed, and excellent reliability is achieved.

Fourth Embodiment

Figure 9:
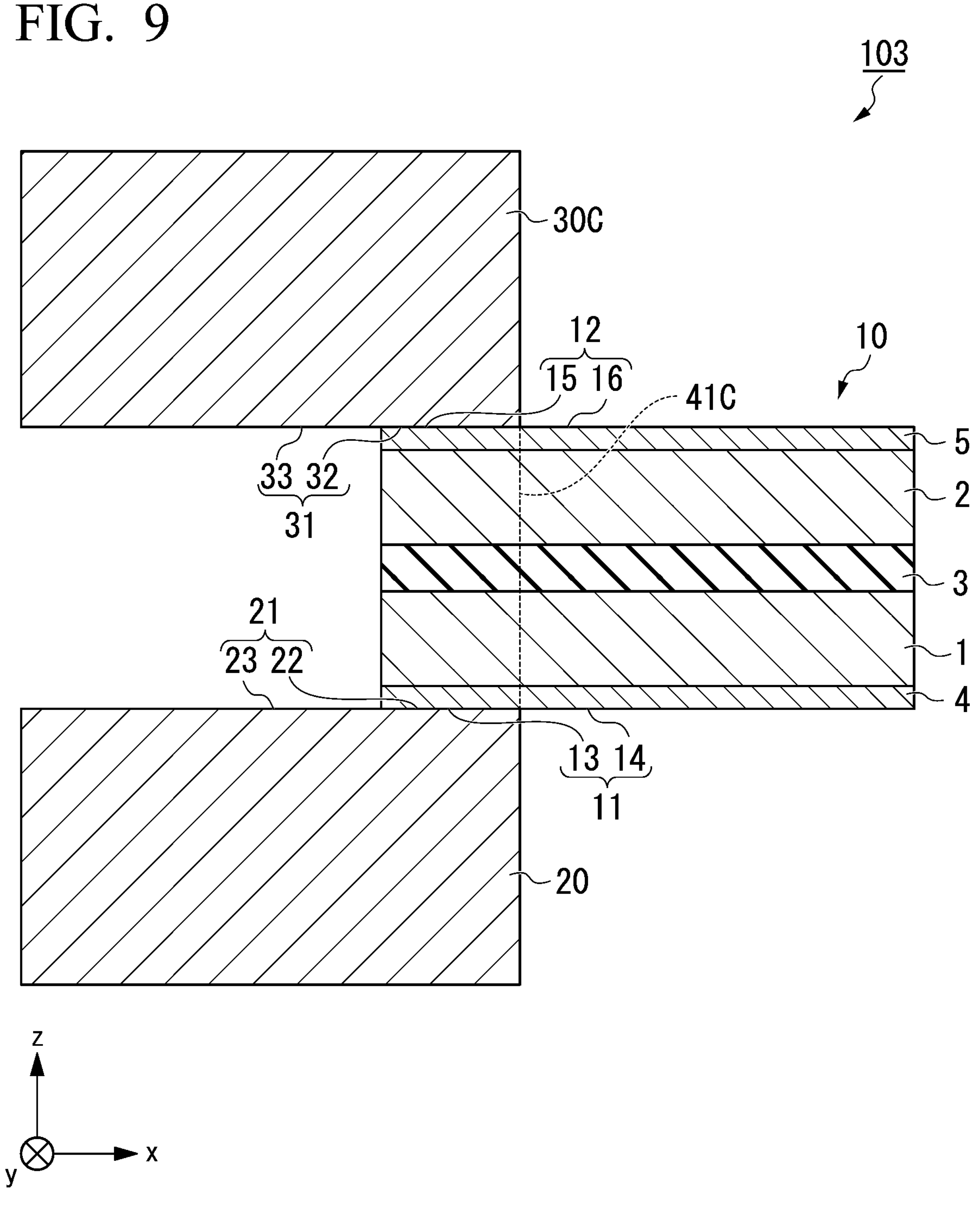
FIG. 9 is a cross-sectional view of a magneto resistive element according to a fourth embodiment.

FIG. 9 is a cross-sectional view of a magneto resistive element 103 according to a fourth embodiment. In the magneto resistive element 103 according to the fourth embodiment, the same reference signs are applied to constituents similar to those of the magneto resistive element 100 according to the first embodiment, and description thereof will be omitted.

The magneto resistive element 103 has the laminate 10, the first conductive layer 20, and a second conductive layer 30C. A geometrical center of the second conductive layer 30C is on the same side as the geometrical center of the first conductive layer 20 with respect to the geometrical center of the laminate 10 in the x direction.

The magneto resistive element 103 according to the fourth embodiment has a first part 41C in which a writing current is concentrated. Therefore, effects similar to those of the magneto resistive element 100 can be obtained.

Fifth Embodiment

Figure 10:
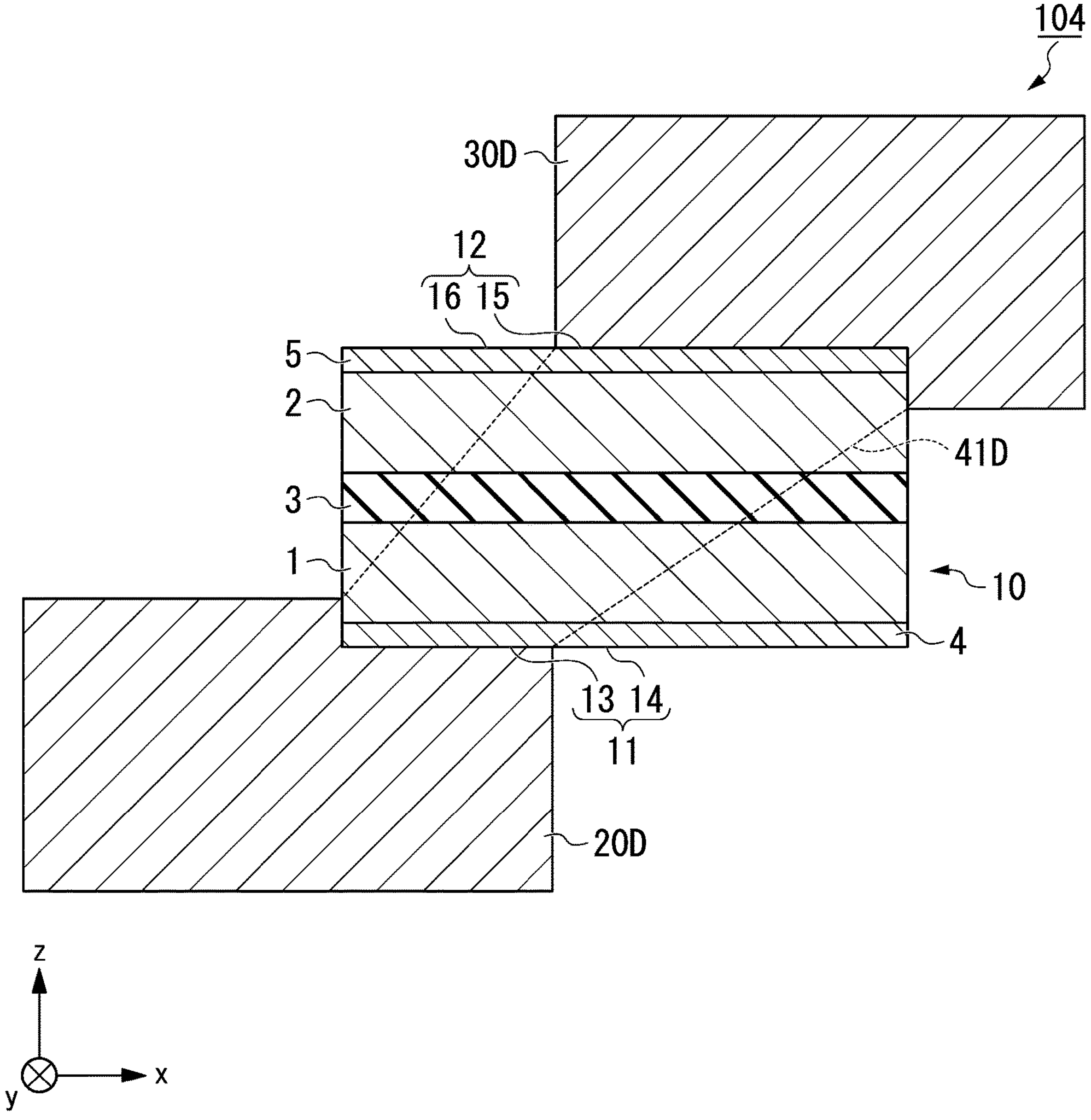
FIG. 10 is a cross-sectional view of a magneto resistive element according to a fifth embodiment.

FIG. 10 is a cross-sectional view of a magneto resistive element 104 according to a fifth embodiment. In the magneto resistive element 104 according to the fifth embodiment, the same reference signs are applied to constituents similar to those of the magneto resistive element 100 according to the first embodiment, and description thereof will be omitted.

The magneto resistive element 104 has the laminate 10, a first conductive layer 20D, and a second conductive layer 30D.

The first conductive layer 20D differs from the first conductive layer 20 in that it comes into contact with a portion of a side wall of the laminate 10. The first conductive layer 20D comes into contact with a side wall of the first ferromagnetic layer 1 or the base layer 4.

The second conductive layer 30D differs from the second conductive layer 30 in that it comes into contact with a portion of the side wall of the laminate 10. The second conductive layer 30D comes into contact with a side wall of the second ferromagnetic layer 2 or the cap layer 5.

In FIG. 10, an example in which both the first conductive layer 20D and the second conductive layer 30D come into contact with the side wall of the laminate 10 has been described, but only one may come into contact therewith.

The magneto resistive element 104 according to the fifth embodiment has a first part 41D in which a writing current is concentrated, and a writing current flowing in the first part 41D has an in-plane component. Therefore, effects similar to those of the magneto resistive element 100 can be obtained. In addition, in the magneto resistive element 104 according to the fifth embodiment, the first conductive layer 20D or the second conductive layer 30D comes into contact with the side wall of the laminate 10. Therefore, a contact resistance between boundary surfaces thereof decreases. When the boundary surface resistance decreases, a specific resistance of the magneto resistive element 104 which is an unchanging resistance decreases. Therefore, a magnetic resistance change rate of the magneto resistive element 104 increases.

Sixth Embodiment

Figure 11:
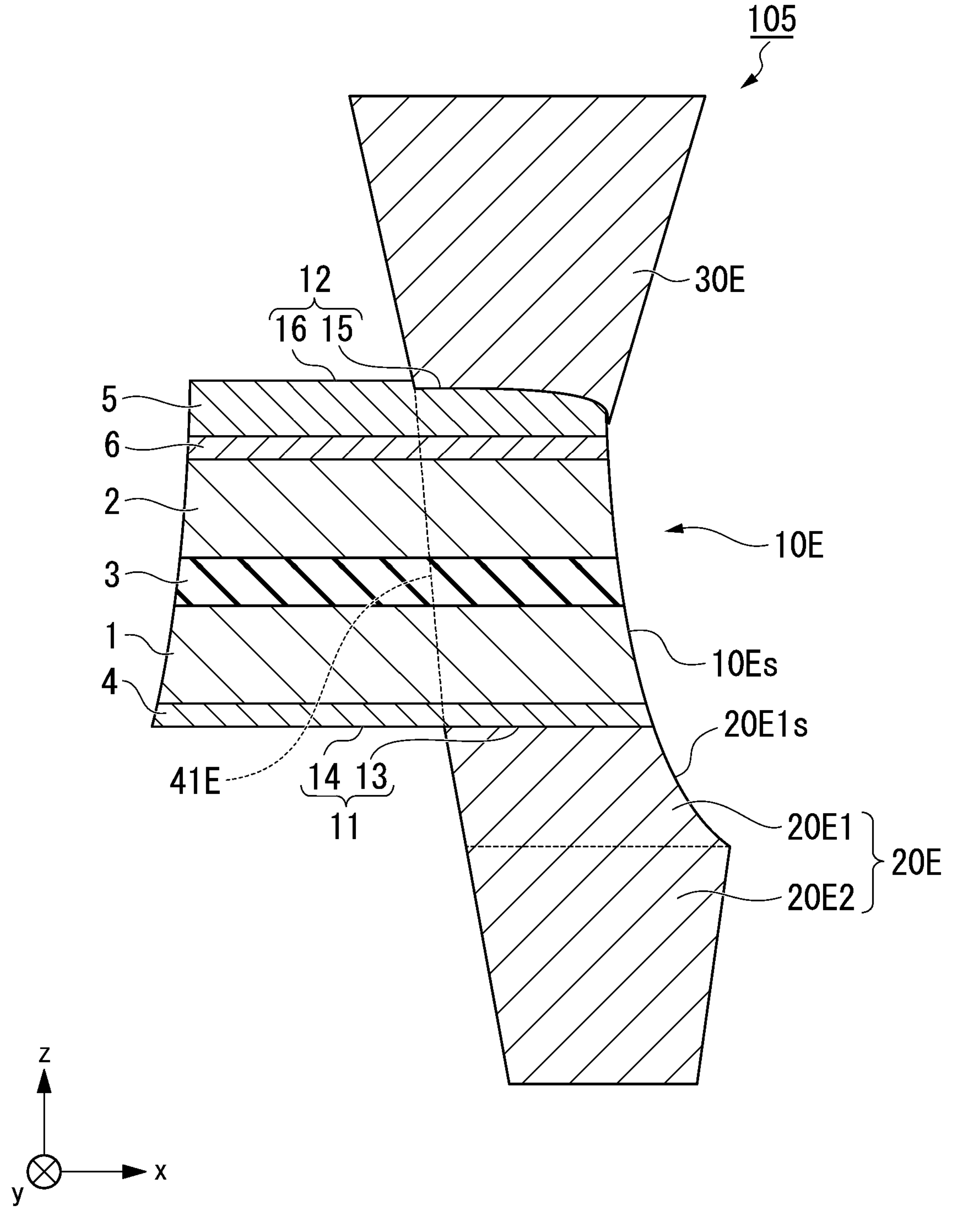
FIG. 11 is a cross-sectional view of a magneto resistive element according to a sixth embodiment.

FIG. 11 is a cross-sectional view of a magneto resistive element 105 according to a sixth embodiment. FIG. 11 illustrates a cross section which passes through a geometrical center of a first conductive layer 20E and a geometrical center of a laminate 10E viewed in the z direction and is cut in the z direction. In the magneto resistive element 105 according to the sixth embodiment, the same reference signs are applied to constituents similar to those of the magneto resistive element 100 according to the first embodiment, and description thereof will be omitted.

The magneto resistive element 105 has the laminate 10E, the first conductive layer 20E, and a second conductive layer 30E. The constitution of each of the laminate 10E, the first conductive layer 20E, and the second conductive layer 30E is substantially the same as the laminate 10, the first conductive layer 20, and the second conductive layer 30 according to the first embodiment. Hereinafter, regarding the laminate 10E, the first conductive layer 20E, and the second conductive layer 30E, parts different from the laminate 10, the first conductive layer 20, and the second conductive layer 30 according to the first embodiment will be described in detail.

A side surface 10Es of the laminate 10E is inclined with respect to the z direction. In addition, the laminate 10E has a vertical magnetic induction layer 6. The vertical magnetic induction layer 6 comes into contact with an upper surface of the second ferromagnetic layer 2. For example, the vertical magnetic induction layer 6 enhances vertical magnetic anisotropy of the second ferromagnetic layer 2. For example, the vertical magnetic induction layer 6 is made of magnesium oxide, W, Ta, Mo, or the like. When the vertical magnetic induction layer 6 is made of magnesium oxide, it is preferable that the magnesium oxide is oxygen-deficient in order to enhance conductivity. For example, a film thickness of the vertical magnetic induction layer 6 is 0.5 nm to 5.0 nm. Since the laminate 10 has the vertical magnetic induction layer 6, an MR ratio of the magneto resistive element 105 can be enhanced.

The first conductive layer 20E is connected to the first surface 11 of the laminate 10E. The first conductive layer 20E comes into contact with a portion of the first surface 11. The first conductive layer 20E has a first columnar portion 20E1 and a second columnar portion 20E2. The first columnar portion 20E1 comes into contact with the laminate 10E. The second columnar portion 20E2 comes into contact with the first columnar portion 20E1. In the z direction, the first columnar portion 20E1 is sandwiched between the second columnar portion 20E2 and the laminate 10E.

A circumferential length of the first columnar portion 20E1 becomes longer moving away from the laminate 10E. A cross-sectional area of the first columnar portion 20E1 increases moving away from the laminate 10E. A circumferential length of the second columnar portion 20E2 becomes shorter moving away from the laminate 10E. A cross-sectional area of the second columnar portion 20E2 is narrowed moving away from the laminate 10E.

As illustrated in FIG. 11, for example, a side surface 20E1*s* of the first columnar portion 20E1 and the side surface 10Es of the laminate 10E are continuously formed. When the side surface 20E1*s* and the side surface 10Es are continuously formed, a current smoothly flows on this boundary surface. That is, occurrence of local concentration of a current on a boundary surface between the first conductive layer 20E and the laminate 10E can be curbed. Local concentration of a current may cause heat generation or the like, which may cause a malfunction of the magneto resistive element 105.

For example, the first conductive layer 20E is produced in the following procedure. First, an opening is formed in an insulating layer, and the inside thereof is filled with a conductor. Further, layers which will serve as the laminate 10E are laminated on the insulating layer and the conductor filling the inside of the opening. Next, when the side surface 10Es of the laminate 10E is formed, an upper portion of the conductor filling the inside of the opening is simultaneously etched. At this time, the side surface 20E1*s* is formed, and the first columnar portion 20E1 is formed. In the conductor filling the inside of the opening, a part which is not etched becomes the second columnar portion 20E2. For example, the side surface 20E1*s* is simultaneously formed at the time of processing when the side surface 10Es of the laminate 10E is formed.

The second conductive layer 30E is connected to the second surface 12 of the laminate 10E. The second conductive layer 30E comes into contact with a portion of the second surface 12. For example, the third region 15 which comes into contact with the second conductive layer 30 is positioned below the fourth region 16 which does not come into contact with the second conductive layer 30. A writing current can be concentrated in a region connecting the first conductive layer 20E and the second conductive layer 30E to each other by satisfying the constitution.

A circumferential length of the second conductive layer 30E becomes longer moving away from the laminate 10E. A cross-sectional area of the second conductive layer 30E increases moving away from the laminate 10E. The second conductive layer 30E comes into contact with a portion of a side wall 10Es of the laminate 10E. For example, the second conductive layer 30E comes into contact with the side wall of the cap layer 5.

The magneto resistive element 105 according to the sixth embodiment has a first part 41E in which a writing current is concentrated. Therefore, effects similar to those of the magneto resistive element 100 can be obtained. In addition, in the magneto resistive element 105 according to the sixth embodiment, the side surface 10Es of the laminate 10E and the side surface 20E1*s* of the first conductive layer 20E are continuously formed. Therefore, local concentration of a current can be avoided. In addition, since the first conductive layer 20E has a two-stage structure, a flow of a current can be made smoother.

Hereinabove, the embodiments of the present invention have been described in detail with reference to the drawings. However, the constituents and combinations thereof in each of the embodiments are examples, and the constituents can be subjected to addition, omission, replacement, and other changes within a range not departing from the gist of the present invention. In addition, characteristic constituents in each of the embodiments may be combined.

EXPLANATION OF REFERENCES

1 First ferromagnetic layer
2 Second ferromagnetic layer
3 Non-magnetic layer
4 Base layer
5 Cap layer
10 Magneto resistive element
11, 21, 31 First surface
12 Second surface
13, 22, 32 First region
14, 23, 33 Second region
15 Third region
16 Fourth region
20, 20A, 20D First conductive layer
30, 30A, 30B, 30C, 30D Second conductive layer
40 Overlapping part
41, 41A, 41B, 41C, 41D First part
100, 100A, 101, 102, 103, 104 Magneto resistive element
200 Magnetic memory
C10, C20, C30 Geometrical center

What is claimed is:

1. A magneto resistive element comprising:

a laminate that includes a first ferromagnetic layer, a second ferromagnetic layer, and a non-magnetic layer located between the first ferromagnetic layer and the second ferromagnetic layer;

a first conductive layer that is connected to a first surface of the laminate in a lamination direction; and a second conductive layer that is connected to a second surface opposite the first surface, wherein the first surface of the laminate includes a first region which directly connects to and directly contacts the first conductive layer, and a second region which does not come into direct contact with the first conductive layer, wherein when viewed in the lamination direction, a geometrical center of the laminate and a geometrical center of the first conductive layer are misaligned with each other, the lamination direction is perpendicular to a plane in which each layer of the laminate extends, and a writing current is configured to flow in the lamination direction within the laminate, between the first conductive layer and the second conductive layer.

2. The magneto resistive element according to claim 1 wherein a circumferential length of the first conductive layer is shorter than a circumferential length of the first surface of the laminate.

3. The magneto resistive element according to claim 1 wherein in a cross section which passes through the geometrical center of the first conductive layer and the geometrical center of the laminate viewed in the lamination direction and is cut in the lamination direction, a width of the first conductive layer is shorter than a width of the laminate.

4. A magneto resistive element comprising:

a laminate that includes a first ferromagnetic layer, a second ferromagnetic layer, and a non-magnetic layer located between the first ferromagnetic layer and the second ferromagnetic layer;

a first conductive layer that is connected to a first surface of the laminate in a lamination direction; and a second conductive layer that is connected to a second surface opposite the first surface, wherein the first surface of the laminate includes a first region which comes into contact with the first conductive layer and a second region which does not come into contact with the first conductive layer, wherein when viewed in the lamination direction, a geometrical center of the laminate and a geometrical center of the first conductive layer are misaligned with each other, the lamination direction is perpendicular to a plane in which each layer of the laminate is spread, and wherein the second surface of the laminate includes a third region which comes into contact with the second conductive layer and a fourth region which does not come into contact with the second conductive layer.

5. A magneto resistive element comprising:

a laminate that includes a first ferromagnetic layer, a second ferromagnetic layer, and a non-magnetic layer located between the first ferromagnetic layer and the second ferromagnetic layer;

a first conductive layer that is connected to a first surface of the laminate in a lamination direction; and a second conductive layer that is connected to a second surface opposite the first surface, wherein the first surface of the laminate includes a first region which comes into contact with the first conductive layer and a second region which does not come into contact with the first conductive layer, wherein when viewed in the lamination direction, a geometrical center of the laminate and a geometrical center of the first conductive layer are misaligned with each other, the lamination direction is perpendicular to a plane in which each layer of the laminate is spread, and wherein when viewed in the lamination direction, the geometrical center of the laminate and a geometrical center of the second conductive layer are misaligned with each other.

6. The magneto resistive element according to claim 1 wherein when viewed in the lamination direction, the geometrical center of the first conductive layer and a geometrical center of the second conductive layer are misaligned with each other.

7. The magneto resistive element according to claim 1 wherein the first conductive layer and the second conductive layer have parts overlapping each other when viewed in the lamination direction.

8. The magneto resistive element according to claim 1 wherein the first conductive layer comes into contact with a portion of a side wall of the laminate.

9. The magneto resistive element according to claim 1 wherein the second conductive layer comes into contact with a portion of a side wall of the laminate.

10. The magneto resistive element according to claim 1 wherein in a cross section which passes through the geometrical center of the first conductive layer and the geometrical center of the laminate viewed in the lamination direction and is cut in the lamination direction, a side surface of the first conductive layer and a side surface of the laminate are continuously formed.

11. The magneto resistive element according to claim 1 wherein the first conductive layer includes a first columnar portion and a second columnar portion, wherein the first columnar portion comes into contact with the laminate, wherein the second columnar portion comes into contact with the first columnar portion, and wherein a circumferential length of the first columnar portion becomes longer moving away from the laminate.

12. The magneto resistive element according to claim 11, wherein the circumferential length of the second columnar portion becomes shorter moving away from the laminate.

13. A magnetic memory comprising:

a plurality of magneto resistive elements according to claim 1.

* * * * *